(12) United States Patent
Seo

(10) Patent No.: US 8,922,233 B2
(45) Date of Patent: Dec. 30, 2014

(54) APPARATUS FOR TESTING A SEMICONDUCTOR DEVICE AND METHOD OF TESTING A SEMICONDUCTOR DEVICE

(75) Inventor: Hun-Kyo Seo, Asan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 342 days.

(21) Appl. No.: 13/404,244

(22) Filed: Feb. 24, 2012

(65) Prior Publication Data

US 2012/0229158 A1 Sep. 13, 2012

(30) Foreign Application Priority Data

Mar. 8, 2011 (KR) .................. 10-2011-0020234

(51) Int. Cl.
*G01R 31/28* (2006.01)

(52) U.S. Cl.
CPC ........ *G01R 31/2894* (2013.01); *G01R 31/2893* (2013.01)
USPC ............ 324/756.02; 324/756.07; 324/757.04; 324/754.1

(58) Field of Classification Search
CPC ........... G01R 31/2893; G01R 31/2886; G01R 31/2831; G01R 1/0483; G01R 1/045; H01L 21/67336
USPC .................... 324/756.02, 537–762.06, 754.1, 324/750.15–750.16
See application file for complete search history.

(56) References Cited

U.S. PATENT DOCUMENTS

| 5,390,129 | A  | * | 2/1995  | Rhodes | .......................... 702/118 |
| 6,268,740 | B1 | * | 7/2001  | Iida   | .......................... 324/750.19 |
| 6,563,331 | B1 | * | 5/2003  | Maeng  | ...................... 324/750.05 |
| 6,640,323 | B2 | * | 10/2003 | Akram  | .......................... 714/724 |
| 2005/0228606 | A1 | * | 10/2005 | Beffa | ............................ 702/119 |
| 2008/0054925 | A1 | * | 3/2008  | Ohkura | ......................... 324/755 |

FOREIGN PATENT DOCUMENTS

| JP | 2000-193718 A | * | 7/2000 | ............ G01R 31/26 |
| JP | 2001-004701 |   | 1/2001 | |
| JP | 2003-004802 |   | 1/2003 | |
| JP | 2009-097899 |   | 5/2009 | |
| KR | 1020050087301 |   | 8/2005 | |

* cited by examiner

*Primary Examiner* — Jermele M Hollington
*Assistant Examiner* — Emily Chan
(74) *Attorney, Agent, or Firm* — F. Chau & Associates, LLC

(57) ABSTRACT

An apparatus for testing a semiconductor device includes a test socket, a test board, an ID reader, and an accumulator. The test socket comprises an ID information pattern and is configured to receive the semiconductor device. The test board is configured to detachably receive the test socket and electrically connect to the test socket. The ID reader is configured to read the ID information pattern and generate an ID signal corresponding to the test socket each time a semiconductor test is performed in the test socket. The accumulator is electrically connected to the ID reader and is configured to accumulate a plurality of ID signals, and store a test number equal to the number of times the test socket is used to perform the semiconductor test. The test number is based on the accumulated ID signals.

18 Claims, 5 Drawing Sheets

APPARATUS FOR TESTING A SEMICONDUCTOR DEVICE AND METHOD OF TESTING A SEMICONDUCTOR DEVICE

CROSS-REFERENCE TO RELATED APPLICATIONS

This application claims priority under 35 U.S.C. §119 to Korean Patent Application No. 10-2011-0020234, filed on Mar. 8, 2011, the disclosure of which is incorporated by reference herein in its entirety.

TECHNICAL FIELD

Exemplary embodiments of the present invention relate to an apparatus for testing a semiconductor device and a method of testing a semiconductor device. More particularly, exemplary embodiments relate to an apparatus for mounting a test socket for receiving a semiconductor device under test (DUT) on a test board and testing the semiconductor device, and a method of testing a semiconductor device using the same.

DISCUSSION OF THE RELATED ART

During the manufacture of a semiconductor device, an integrated circuit pattern may be formed on a wafer, the wafer may be separated into semiconductor chips, and the semiconductor chips may be packaged.

In order to perform various test processes, the packaged semiconductor devices may be inserted into test sockets of an automated test apparatus. The test apparatus may include a plurality of test sockets disposed in a matrix arrangement, which may be used to test a plurality of semiconductor devices.

The test sockets may be mounted on a test board and electrical signals may be supplied in order to perform electrical test processes. For example, a DUT may be inserted into a test socket by an automated handler and electrical test processes may be performed.

As the test socket is used to perform numerous tests on a DUT, the test socket may reach the end of its operational life span. As a result, the reliability of test results may deteriorate and the testing process may have to be stopped in order to replace the test socket.

SUMMARY

Exemplary embodiments of the present invention provide an apparatus for testing a semiconductor device capable of managing the entire lifecycle of a test socket for receiving a semiconductor device.

Exemplary embodiments provide a method of testing a semiconductor device using the apparatus.

According to an exemplary embodiment, an apparatus for testing a semiconductor device includes a plurality of test sockets configured to respectively receive semiconductor devices. Each of the test sockets includes an ID information pattern. A test board is configured to detachably mount the test sockets, electrically connect to the test sockets, and test the semiconductor device. ID readers respectively communicate with the ID information patterns of the test sockets and generate an ID signal for the test sockets when the semiconductor device is tested in the test socket. An accumulator is electrically connected to the ID readers, and is configured to accumulate the ID signals of the test sockets and store the number of times each of the test sockets is used to test the semiconductor device.

In an exemplary embodiment, the ID information pattern may include a plurality of open/short patterns for generating a specific bit signal.

In an exemplary embodiment, the ID reader may include detection patterns that make contact with the open/short patterns when the test socket is mounted on the test board.

In an exemplary embodiment, the open/short patterns may be formed on a lower surface of the test socket and the detection patterns may be formed on an upper surface of the test board in an area corresponding to the open/short patterns.

In an exemplary embodiment, the ID reader may generate the specific bit signal after receiving a test starting signal for the semiconductor device.

In an exemplary embodiment, the apparatus may further include a plurality of socket guides configured to fix the test sockets to the test board.

In an exemplary embodiment, a plurality of open/short patterns of the ID information pattern may be formed on an upper surface of the test socket, and detection patterns of the ID reader may be formed on an outer surface of the socket guide in an area corresponding to the open/short patterns.

In an exemplary embodiment, the test sockets may be disposed in a matrix arrangement such that a parallel test process may be performed on the semiconductor devices.

In an exemplary embodiment, the apparatus may further include a controller connected to the accumulator configured to compare the accumulated test number of the respective test socket with a reference value representing a predetermined life span and determine whether the respective test socket should be replaced.

According to an exemplary embodiment, a method of testing a semiconductor device includes detachably mounting a plurality of test sockets for respectively receiving semiconductor devices on a test board. ID information patterns of the test sockets communicate with ID readers of the test board, respectively. An ID signal for test socket is generated by the ID reader when the semiconductor device is tested in the test socket. The ID signals of the test sockets are accumulated, and the number of times each of the test sockets is used to test the semiconductor device is stored based on the accumulated ID signals.

In an exemplary embodiment, establishing communication between the ID information patterns and the ID readers may include forming the ID information pattern including open/short patterns for generating a specific bit signal on the test socket, and making contact between the open/short patterns and detection patterns of the ID reader when the test socket is mounted on the test board.

In an exemplary embodiment, the open/short patterns may be formed on a lower surface of the test socket, and the detection patterns may be formed on an upper surface of the test board in an area corresponding to the open/short patterns.

In an exemplary embodiment, generating an ID signal for a test socket by the ID reader may include generating the specific bit signal after receiving a test starting signal for the semiconductor device.

In an exemplary embodiment, mounting the test sockets on the test board may include using a plurality of socket guides to fix the test sockets to the test board.

In an exemplary embodiment, the method may further include comparing the accumulated test number of the respective test socket with a reference value representing a predetermined life span to determine whether the respective test socket should be replaced.

According to an exemplary embodiment, an apparatus for testing a semiconductor device may include a ID reader configured to generate an ID signal for a test socket when a semiconductor device is tested in the test socket, and an accumulator electrically connected to the ID reader and configured to accumulate the ID signal of the test socket and store the number of times the test socket is used to test the semiconductor device.

Accordingly, the accumulated test number of the test socket may be compared with a reference value representing a predetermined life span to determine whether the test socket should be replaced. Thus, during manufacture of a semiconductor device, the entire lifecycle of the test socket may be managed.

According to an exemplary embodiment, an apparatus for testing a semiconductor device includes a test socket, a test board, an ID reader, and an accumulator. The test socket comprises an ID information pattern and is configured to receive the semiconductor device. The test board is configured to detachably receive the test socket and electrically connect to the test socket. The ID reader is configured to read the ID information pattern and generate an ID signal corresponding to the test socket each time a semiconductor test is performed in the test socket. The accumulator is electrically connected to the ID reader and is configured to accumulate a plurality of ID signals and store a test number equal to the number of times the test socket is used to perform the semiconductor test. The test number is based on the accumulated ID signals.

According to an exemplary embodiment, a method of testing a semiconductor device includes detachably mounting a test socket on a test board, reading an ID information pattern disposed on the test socket, generating an ID signal corresponding to the test socket each time a semiconductor test is performed in the test socket, accumulating a plurality of ID signals corresponding to the test socket, and storing a test number equal to the number of times the test socket is used to perform the semiconductor test. The test socket is configured to receive the semiconductor device, and the test number is based on the accumulated ID signals.

According to an exemplary embodiment, an apparatus for testing a semiconductor device includes an ID reader and an accumulator. The ID reader is configured to read an ID information pattern disposed on a test socket and generate an ID signal corresponding to the test socket each time a semiconductor test is performed in the test socket. The accumulator is electrically connected to the ID reader and is configured to accumulate a plurality of ID signals and store a test number equal to the number of times the test socket is used to perform the semiconductor test. The test number is based on the accumulated ID signals.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
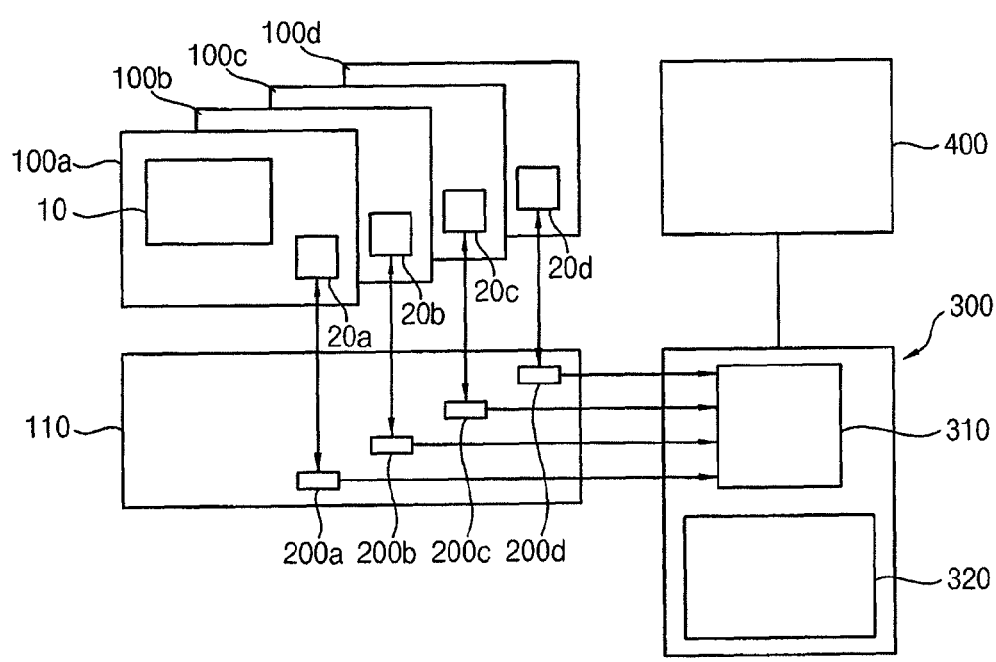
FIG. 1 is a block diagram illustrating an apparatus for testing a semiconductor device, according to an exemplary embodiment of the present invention.

Exemplary embodiments of the present invention will be described more fully hereinafter with reference to the accompanying drawings. Like reference numerals may refer to like elements throughout the accompanying drawings.

Figure 2:
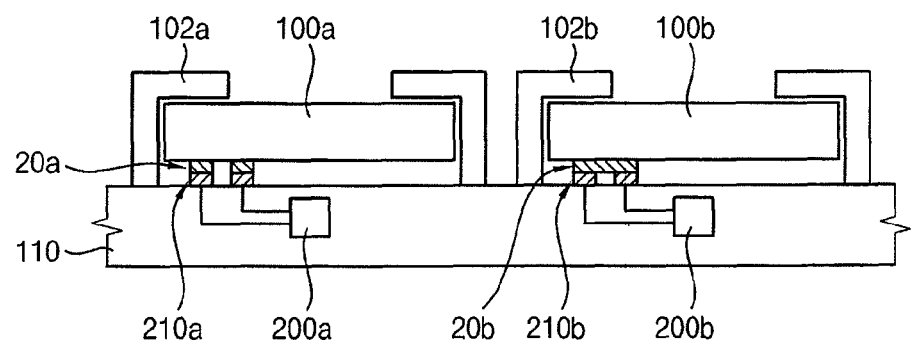
FIG. 2 is a cross-sectional view illustrating an apparatus for testing a semiconductor device, according to an exemplary embodiment of the present invention.
Figure 3:
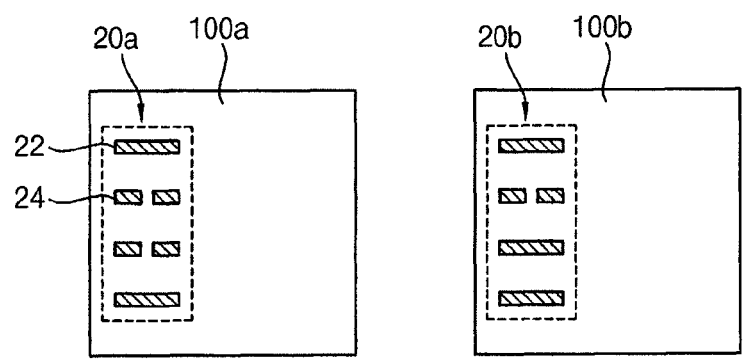
FIG. 3 is a bottom view illustrating a test socket of the apparatus shown in FIG. 2, according to an exemplary embodiment of the present invention.
Figure 4:
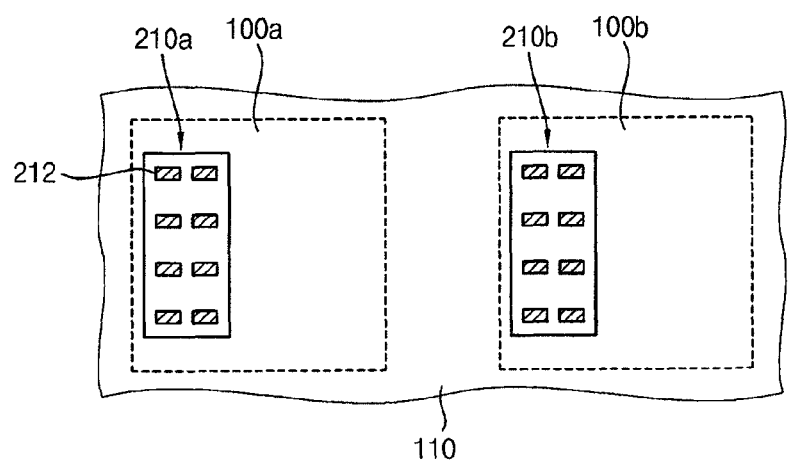
FIG. 4 is a plan view illustrating a test board of the apparatus shown in FIG. 2, according to an exemplary embodiment of the present invention.
Figure 5:
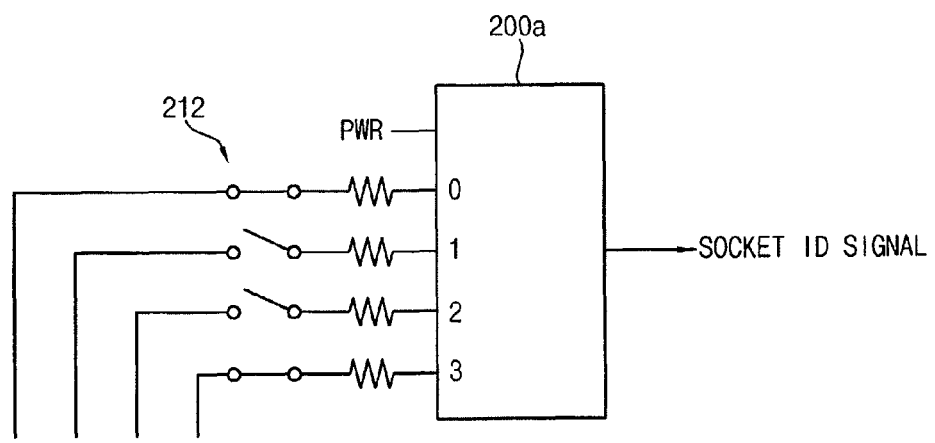
FIG. 5 is a block diagram illustrating an ID signal corresponding to a test socket generated in an ID reader of the apparatus shown in FIG. 2, according to an exemplary embodiment of the present invention.
Figure 6:
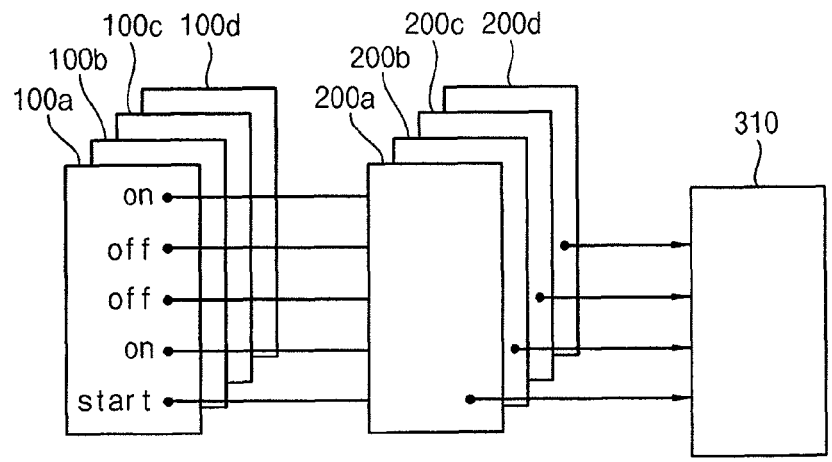
FIG. 6 is a block diagram illustrating the flow of ID signals for a test socket in the apparatus shown in FIG. 2, according to an exemplary embodiment of the present invention.

FIG. 1 is a block diagram illustrating an apparatus for testing a semiconductor device according to an exemplary embodiment. Hereinafter, a semiconductor device tested using the testing apparatus may be referred to as a "device under test" (DUT). FIG. 2 is a cross-sectional view illustrating an apparatus for testing a semiconductor device, according to an exemplary embodiment. FIG. 3 is a bottom view illustrating a test socket of the apparatus in FIG. 2 according to an exemplary embodiment. FIG. 4 is a plan view illustrating a test board of the apparatus shown in FIG. 2 according to an exemplary embodiment. FIG. 5 is a block diagram illustrating an ID signal corresponding to a test socket generated in an ID reader of the apparatus shown in FIG. 2 according to an exemplary embodiment. FIG. 6 is a block diagram illustrating the flow of ID signals for a test socket in the apparatus shown in FIG. 2 according to an exemplary embodiment.

Referring to FIGS. 1 and 2, an apparatus for testing a semiconductor device 10 according to an exemplary embodiment may include a plurality of test sockets 100a, 100b, 100c, 100d, a test board 110 for mounting the test sockets 100a, 100b, 100c, 100d, a tester 300 for testing a semiconductor device 10 in the test sockets 100a, 100b, 100c, 100d via the test board 110, ID readers 200a, 200b, 200c, 200d for generating ID signals of the test sockets 100a, 100b, 100c, 100d, and an accumulator 310 for accumulating the ID signals from the ID readers 200a, 200b, 200c, 200d.

In an exemplary embodiment, the tester 300 may input a test signal to a semiconductor device 10 received in one of the test socket 100a, 100b, 100c, 100d to generate test result information indicating whether the semiconductor device 10 is operating normally.

For example, the tester 300 may generate a test signal for a semiconductor device 10, and a test circuit 320 included in the tester 300 may analyze a response signal received from the semiconductor device 10. The test circuit 320 may analyze the test result information of the semiconductor device 10 to determine whether the semiconductor device 10 is operating normally.

For example, the test circuit 320 may sequentially perform electrical inspections based on a test starting signal. The electrical inspections result in the collection, storage and accumulation of test result information. In an exemplary embodiment, the test circuit 320 may include a timing generator, a pattern generator, or a waveform shaper.

In an exemplary embodiment, the testing apparatus may further include a handler. The handler may load a semiconductor device 10 onto a testing site using a controller 400, insert the semiconductor device 10 into a test socket 100a, 100b, 100c, 100d of the test board 110, and apply the test starting signal to the tester 300. The handler may further sort and unload the semiconductor device 10 based on received test results upon receiving a test ending signal.

In an exemplary embodiment, the test sockets 100a, 100b, 100c, 100d may be detachably mounted on the test board 110. In addition, in an exemplary embodiment, the test sockets 100a, 100b, 100c, 100d may be disposed in a matrix arrangement such that a parallel test process may be performed on a plurality of the semiconductor devices 10.

Each of the test sockets 100a, 100b, 100c, 100d may include a plurality of connector pins for electrically connecting to outer connection terminals of the semiconductor device 10. The connector pins may be supported elastically in the test socket 100a, 100b, 100c, 100d by an elastic member. The connector pins may be electrically connected to connection terminals of the test board 110.

As illustrated in FIG. 2, the test sockets 100a, 100b may be attached to the test board 110 by socket guides 102a, 102b. The socket guides 102a, 102b guide the semiconductor devices 10 into the test sockets 100a, 100b when the handler pressurizes the semiconductor devices 10 in the test sockets 100a, 100b.

As will be appreciated by one of ordinary skill in the art, the arrangement and the structure of the test sockets 100a, 100b and the socket guides 102a, 102b are not limited to the exemplary embodiment shown in FIG. 2, and may be determined based on the size and type of the semiconductor devices 10 under test. Additionally, the number of test sockets 100a, 100b, 100c, 100d may be determined based on the number of the semiconductor devices 10 under test.

As illustrated in FIG. 1, the test sockets 100a, 100b, 100c, 100d may include ID information patterns 20a, 20b, 20c, 20d to distinguish the test sockets 100a, 100b, 100c, 100d from each other. The ID readers 200a, 200b, 200c, 200d may read the ID information patterns 20a, 20b, 20c, 20d and generate ID signals for the test sockets 100a, 100b, 100c, 100d when an inspection process is performed to test a semiconductor device 10.

Referring to FIGS. 3 to 5, the ID information patterns 20a, 20b of the test sockets 100a, 100b may include a plurality of open/short patterns 22, 24. The open/short patterns 22, 24 generate a specific bit signal. A detection portion 210a, 210b of each ID reader 200a, 200b may include detection patterns 212 that selectively contact the open/short patterns 22, 24.

For example, the open/short patterns 22, 24 may be formed on a lower surface of the test sockets 100a, 100b. The detection patterns 212 may be formed on an upper surface of the test board 110 facing the lower surface of the test sockets 100a, 100b. The detection patterns 212 may be positioned in an area corresponding to the area where the test sockets 100a, 100b are mounted, and may correspond to the open/short patterns 22, 24 (e.g., a region denoted by the dotted line in FIG. 4).

The open/short patterns 22, 24 of the test sockets 100a, 100b may function as a switch that turns the detection patterns 212 of the ID readers 200a, 200b on or off.

The short patterns 22 of the test sockets 100a, 100b may make contact with a pair of the detection patterns 212 of the ID readers 200a, 200b, and may electrically turn the corresponding detection patterns 212 on. The open pattern 24 of the test sockets 100a, 100b may make contact with a pair of the detection patterns 212 of the ID readers 200a, 200b, and may electrically turn the corresponding detection patterns 212 off.

Accordingly, the open/short patterns 22, 24 having a specific arrangement may represent specific ID information for the test sockets 100a, 100b. As a result, the open/short patterns 22, 24 may make contact with the detection patterns 212 of the ID readers 200a, 200b, and may generate a specific bit signal for the test sockets 100a, 100b.

As illustrated in FIGS. 4 and 5, the ID information patterns 20a, 20b of the test sockets 100a, 100b may include open/short patterns 22, 24 having a specific arrangement. As a result, when the test sockets 100a, 100b are mounted on the test board 110, the open/short patterns 22, 24 may make contact with the detection patterns 212 of the ID reader 200a of the test board 110.

The tester 300 may sequentially perform electrical inspections using the test starting signal, and an ID reader (e.g., 200a) may receive the test starting signal and generate a specific bit signal (e.g., binary number 1001) for the corresponding test socket (e.g., 100a).

In an exemplary embodiment, the four open/short patterns 22, 24 and the corresponding four pairs of detection patterns 212 may be used to generate a 4-bit signal. However, as will be appreciated by one of ordinary skill in the art, the number and shape of the open/short patterns 22, 24 and the detection patterns 212 are not limited thereto.

Referring to FIG. 6, the accumulator 310 may be electrically connected to the ID readers 200a, 200b, 200c, 200d, accumulate ID signals of the test sockets 100a, 100b, 100c, 100d, and store the number of times each of the test sockets 200a, 200b, 200c, 200d is used to test a semiconductor device 10.

The accumulator 310 may receive an ID signal for each of the respective test sockets 100a, 100b, 100c, 100d when an inspection process is performed to test a semiconductor device 10, and store the number of times a semiconductor device 10 is tested in each of the respective test sockets 100a, 100b, 100c, 100d.

The controller 400 may be connected to the accumulator 310 and may compare the accumulated test number of each of the respective test sockets 100a, 100b, 100c, 100d with a reference value representing a predetermined life span to determine whether any of the respective test sockets 100a, 100b, 100c, 100d should be replaced. For example, the controller 400 may communicate with the accumulator 310 via a wired or wireless connection.

The controller 400 may compare the accumulated test number for each of the test sockets 100a, 100b, 100c, 100d stored in the accumulator 310 with the reference value representing the predetermined life span to determine whether any of the test sockets 100a, 100b, 100c, 100d are defective. Accordingly, if the accumulated test number of one of the test sockets 100a, 100b, 100c, 100d is greater than the reference value, the respective test socket may be determined to be defective. The defective test socket may then be replaced with a new test socket.

In an exemplary embodiment, because each of the test sockets 100a, 100b, 100c, 100d has its own ID information pattern 20a, 20b, 20c, 20d, an inspector may not need to separately maintain the information of the test sockets 100a, 100b, 100c, 100d even though the test sockets 100a, 100b, 100c, 100d are mounted in different areas of the test board 110. As a result, inspection and maintenance of the test sockets 100a, 100b, 100c, 100d may be more easily managed.

Hereinafter, a method of testing a semiconductor device using the test apparatus of FIG. 1 according to an exemplary embodiment will be described.

Figure 7:
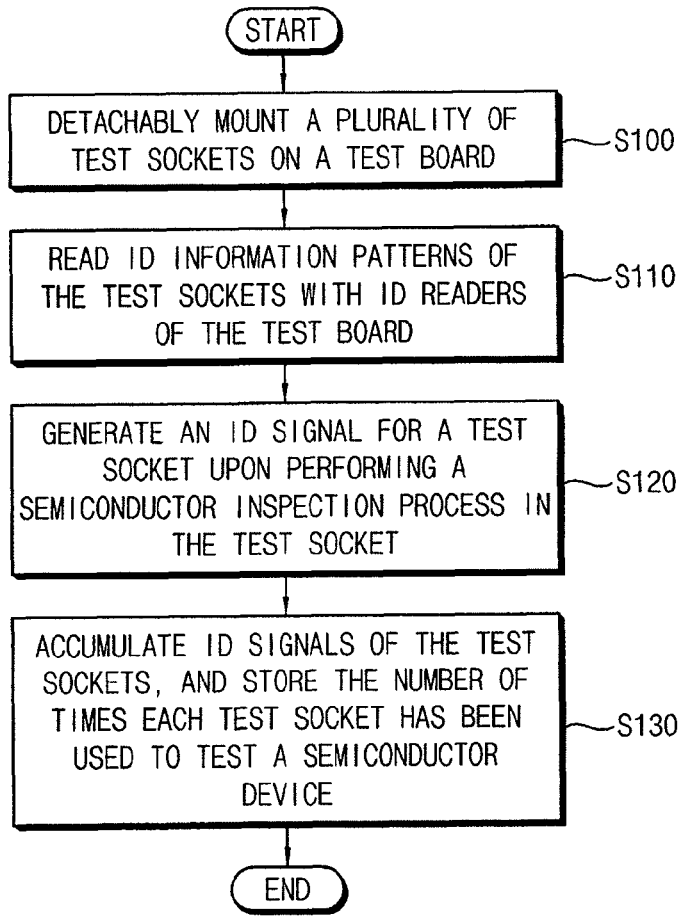
FIG. 7 is a flow chart illustrating a method of testing a semiconductor device, according to an exemplary embodiment of the present invention.

FIG. 7 is a flow chart illustrating a method of testing a semiconductor device, according to an exemplary embodiment.

Referring to FIGS. 1, 2 and 7, a plurality of test sockets 100a, 100b, 100c, 100d for receiving a semiconductor device 10 to be tested may be detachably mounted on a test board 110 (S100).

In an exemplary embodiment, a test handler may load semiconductor devices 10 onto a testing site, insert the semiconductor devices 10 into the test sockets 100a, 100b, 100c, 100d on the test board 110, and apply the test starting signal to the tester 300.

The test sockets 100a, 100b, 100c, 100d may be disposed in a matrix arrangement such that a parallel test process may be performed on a plurality of the semiconductor devices 10, however the arrangement of the test sockets 100a, 100b, 100c, 100d is not limited thereto.

As shown in FIG. 2, the test sockets 100a, 100b may be fixed to the test board 110 by socket guides 102a, 102b. The socket guides 102a, 102b may guide the semiconductor devices 10 to be inserted into the test sockets 100a, 100b when the handler pressurizes the semiconductor devices 10 in the test sockets 100a, 100b.

ID information patterns 20a, 20b, 20c, 20d of the test sockets 100a, 100b, 100c, 100d may then be electrically connected to ID readers 200a, 200b, 200c, 200d of the test board 110, and the ID information patterns 20a, 20b, 20c, 20d may be read by the ID readers 200a, 200b, 200c, 200d, respectively (S110).

As illustrated in FIGS. 3 to 5, ID information patterns 20a, 20b may be formed on the test sockets 100a, 100b, respectively. The ID information patterns 20a, 20b may include a plurality of open/short patterns 22, 24 that generate a specific bit signal. When the test sockets 100a, 100b are mounted on the test board 110, the open/short patterns 22, 24 may make contact with the detection patterns 212 of the ID readers 200a, 200b, respectively.

When an inspection process is performed to test a semiconductor device 10, an ID signal for the test sockets 100a, 100b may be generated by the ID readers 200a, 200b (S120).

A tester 300 may sequentially perform electrical inspections based on a test starting signal. The tester 300 may collect, store and accumulate test result information. Once the ID readers 200a, 200b receive the test starting signal, the ID readers 200a, 200b may generate a specific bit signal (e.g., ID signal) for the corresponding test socket 100a, 100b.

The ID signals of the test sockets 100a, 100b may be accumulated, and the number of times each of the test sockets 100a, 100b is used to test a semiconductor device 10 may be stored (S130).

As illustrated in FIG. 6, an accumulator 310 may be electrically connected to the ID readers 200a, 200b, 200c, 200d, may accumulate the ID signals of the test sockets 100a, 100b, 100c, 100d, and may store the number of times each of the test sockets 100a, 100b, 100c, 100d is used to test a semiconductor device 10.

The accumulator 310 may receive an ID signal for each of the test sockets 100a, 100b, 100c, 100d each time an inspection process is performed to test a semiconductor device 10 at the test sockets 100a, 100b, 100c, 100d, and store the number of times each test socket 100a, 100b, 100c, 100d has been used to test a semiconductor device 10.

The accumulated test number of each of the test socket 100a, 100b, 100c, 100d may be compared with a reference value representing a predetermined life span, and it may be determined whether any of the test sockets 100a, 100b, 100c, 100d should be replaced.

A controller 400 may compare the accumulated test number stored in the accumulator 310 with the reference value representing the predetermined life span to determine whether a test socket 100a, 100b, 100c, 100d is defective. If the accumulated test number of a test socket 100a, 100b, 100c, 100d is greater than the reference value, the test socket 100a, 100b, 100c, 100d may be determined to be defective, and the defective test socket(s) may be replaced.

Figure 8:
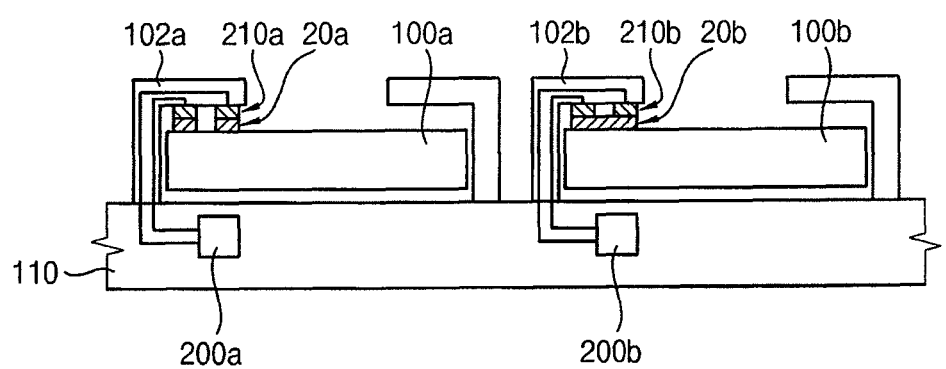
FIG. 8 is a cross-sectional view illustrating an apparatus for testing a semiconductor device, according to an exemplary embodiment of the present invention.

FIG. 8 is a cross-sectional view illustrating an apparatus for testing a semiconductor device, according to an exemplary embodiment. The testing apparatus in FIG. 8 is similar to the testing apparatus shown in FIG. 2, however the testing apparatus in FIG. 8 includes a different connection arrangement between the ID information pattern of a test socket and the detection patterns of an ID reader. The same reference numerals will be used to refer to the same or like elements as those described with reference to FIG. 2.

Referring to FIG. 8, a plurality of open/short patterns 22, 24 of an ID information pattern 20a, 20b may be formed on an upper surface of a test socket 100a, 100b. Detection patterns 212 of a detection portion 210a, 210b of an ID reader 200a, 200b may be formed on an outer surface of a socket guide 102a, 102b in an area corresponding to the open/short patterns 22, 24.

The connection arrangement between the ID information patterns 20a, 20b and the detection patterns 212 of the ID readers 200a, 200b may be determined based on the socket guides 102a, 102b and the semiconductor devices 10 received in the test sockets 100a, 100b, however the connection arrangement is not limited thereto.

Hereinafter, a method of testing a semiconductor device using the testing apparatus shown in FIG. 8 will be explained.

A method of testing a semiconductor device according to an exemplary embodiment may include similar blocks to those described with reference to FIG. 7, however certain differences may exist with reference to block S110.

As illustrated in FIG. 8, after block S100 in FIG. 7, the open/short patterns 22, 24 on the upper surface of the test sockets 100a, 100b may be connected to the detection patterns 212 of the ID readers 200a, 200b on the outer surface of the socket guides 102a, 102b, respectively.

Accordingly, the ID information patterns 20a, 20b of the test sockets 100a, 100b may be electrically connected to the ID readers 200a, 200b provided in the test board 110.

Blocks S120 and S130 may be performed to accumulate and store the number of times each of the test sockets 100a, 100b has been used to test a semiconductor device 10. The accumulated test numbers of the test sockets 100a, 100b may then be compared with a reference value representing a predetermined life span to determine whether any of the test sockets 100a, 100b are defective.

As described above, an apparatus for testing a semiconductor device in accordance with exemplary embodiments of the present invention may include an ID reader that generates an ID signal for a test socket when a semiconductor device is tested in the test socket, and an accumulator electrically connected to the ID reader that accumulates the ID signal of the test socket and stores the number of times the test socket has been used to test the semiconductor device.

The accumulated test number of the test socket may be compared with a reference value representing a predetermined life span to determine whether the test socket should be replaced. Thus, during the manufacture of a semiconductor device, the entire lifecycle of the test socket may be managed.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. An apparatus for testing a plurality of semiconductor devices, comprising:
    a plurality of test sockets, wherein each test socket comprises an ID information pattern formed on the test socket, and each test socket is configured to receive one of the semiconductor devices;
    a test board configured to detachably receive the test sockets and electrically connect to the test sockets;
    a plurality of ID readers configured to read the ID information patterns and generate an ID signal corresponding to one of the test sockets each time a semiconductor test is performed in the one of the test sockets; and
    an accumulator electrically connected to the ID readers, and configured to accumulate a plurality of ID signals and store a test number for each test socket equal to the number of times the test socket is used to perform the semiconductor test, wherein the test numbers are based on the accumulated ID signals.

2. The apparatus of claim 1, wherein each ID information pattern comprises a plurality of open/short patterns.

3. The apparatus of claim 1, wherein each ID reader is configured to generate a specific bit signal.

4. The apparatus of claim 3, wherein each ID reader is configured to generate the specific bit signal upon receiving a test starting signal.

5. The apparatus of claim 1, further comprising a plurality of socket guides configured to mount the test sockets onto the test board.

6. The apparatus of claim 1, wherein the plurality of test sockets are disposed in a matrix arrangement.

7. The apparatus of claim 1, further comprising a controller connected to the accumulator, and configured to compare each stored test number with a reference value representing a predetermined life span of the corresponding test socket.

8. An apparatus for testing a semiconductor device, comprising:
    a test socket comprising an ID information pattern, and configured to receive the semiconductor device;
    a test board configured to detachably receive the test socket and electrically connect to the test socket;
    an ID reader configured to read the ID information pattern and generate an ID signal corresponding to the test socket each time a semiconductor test is performed in the test socket; and
    an accumulator electrically connected to the ID reader, and configured to accumulate a plurality of ID signals and store a test number equal to the number of times the test socket is used to perform the semiconductor test, wherein the test number is based on the accumulated ID signals,
    wherein the ID information pattern comprises a plurality of open/short patterns,
    wherein the ID reader comprises detection patterns disposed on the ID reader,
    wherein the detection patterns make electrical contact with the open/short patterns upon mounting the test socket on the test board.

9. The apparatus of claim 8, wherein the open/short patterns are formed on a lower surface of the test socket, and the detection patterns are formed on an upper surface of the test board in an area corresponding to the open/short patterns.

10. An apparatus for testing a semiconductor device, comprising:
    a test socket comprising an ID information pattern, and configured to receive the semiconductor device;
    a test board configured to detachably receive the test socket and electrically connect to the test socket;
    an ID reader configured to read the ID information pattern and generate an ID signal corresponding to the test socket each time a semiconductor test is performed in the test socket;
    an accumulator electrically connected to the ID reader, and configured to accumulate a plurality of ID signals and store a test number equal to the number of times the test socket is used to perform the semiconductor test, wherein the test number is based on the accumulated ID signals; and
    a socket guide configured to mount the test socket onto the test board,
    wherein the ID information pattern comprises a plurality of open/short patterns formed on an upper surface of the test socket, and the ID reader comprises detection patterns formed on an outer surface of the socket guide in an area corresponding to the open/short patterns.

11. A method of testing a plurality of semiconductor devices, comprising:
    detachably mounting a plurality of test sockets on a test board, wherein each test socket is configured to receive one of the semiconductor devices;
    reading an ID information pattern disposed on each of the test sockets;
    generating an ID signal corresponding to one of the test sockets each time a semiconductor test is performed in the one of the test sockets;
    accumulating a plurality of ID signals corresponding to the test sockets; and
    storing a test number for each test socket equal to the number of times the test socket is used to perform the semiconductor test, wherein the test numbers are based on the accumulated ID signals.

12. The method of claim 11, wherein mounting the test sockets on the test board comprises attaching the test sockets to the test board using a plurality of socket guides.

13. The method of claim 11, further comprising comparing each stored test number with a reference value representing a predetermined life span of the corresponding test socket.

14. A method of testing a semiconductor device, comprising:
    detachably mounting a test socket on a test board, wherein the test socket is configured to receive the semiconductor device;
    reading an ID information pattern disposed on the test socket;
    generating an ID signal corresponding to the test socket each time a semiconductor test is performed in the test socket;
    accumulating a plurality of ID signals corresponding to the test socket;
    storing a test number equal to the number of times the test socket is used to perform the semiconductor test, wherein the test number is based on the accumulated ID signals;
    forming a plurality of open/short patterns on the ID information pattern;
    forming a plurality of detection patterns on an ID reader on the test board; and
    electrically connecting the open/short patterns and the detection patterns upon mounting the test socket on the test board.

15. The method of claim 14, wherein the open/short patterns are formed on a lower surface of the test socket, and the detection patterns are formed on an upper surface of the test board in an area corresponding to the open/short patterns.

16. The method of claim 14, further comprising generating a specific bit signal by the ID reader using the open/short patterns and the detection patterns.

17. The method of claim 16, wherein generating the ID signal comprises generating the specific bit signal upon receiving a test starting signal for the semiconductor device.

18. An apparatus for testing a semiconductor device, comprising:
- an ID reader configured to read an ID information pattern disposed on a test socket, and generate an ID signal corresponding to the test socket each time a semiconductor test is performed in the test socket; and
- an accumulator electrically connected to the ID reader, and configured to accumulate a plurality of ID signals and store a test number equal to the number of times the test socket is used to perform the semiconductor test, wherein the test number is based on the accumulated ID signals,
- wherein the ID information pattern comprises a plurality of open/short patterns, and the ID reader comprises a plurality of detection patterns,
- wherein the open/short patterns and the detection patterns make electrical contact upon mounting the test socket to a test board.

* * * * *